(12) United States Patent
Benvenga

(10) Patent No.: US 7,673,210 B2
(45) Date of Patent: Mar. 2, 2010

(54) METHODS AND APPARATUS FOR DIAGNOSING A DEGREE OF INTERFERENCE BETWEEN A PLURALITY OF FAULTS IN A SYSTEM UNDER TEST

(75) Inventor: Carl E. Benvenga, Fort Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 811 days.

(21) Appl. No.: 11/581,142

(22) Filed: Oct. 12, 2006

(65) Prior Publication Data

US 2008/0104470 A1    May 1, 2008

(51) Int. Cl.
*G06F 11/00* (2006.01)

(52) U.S. Cl. .......................... 714/741; 714/33

(58) Field of Classification Search .................. 714/26, 714/738, 48, 739, 741, 33; 702/183; 717/124
See application file for complete search history.

(56) References Cited

U.S. PATENT DOCUMENTS

| | | | |
|---|---|---|---|
| 5,808,919 A | 9/1998 | Preist et al. | |
| 5,922,079 A * | 7/1999 | Booth et al. | 714/26 |
| 6,167,352 A | 12/2000 | Kanevsky et al. | |
| 7,089,474 B2 * | 8/2006 | Burdine et al. | 714/738 |
| 7,096,458 B2 * | 8/2006 | Bates et al. | 717/124 |
| 7,409,317 B2 * | 8/2008 | Cousin et al. | 702/183 |
| 7,509,234 B2 * | 3/2009 | Unnikrishnan et al. | 702/183 |
| 7,509,538 B2 * | 3/2009 | Triou et al. | 714/48 |

* cited by examiner

*Primary Examiner*—David Ton

(57) ABSTRACT

A method for diagnosing a degree of interference between a plurality of faults in a system under test, the faults being detected by means of applying a test suite to the system under test, includes: 1) for each of the plurality of faults, and for each of a plurality of test syndromes, where a test syndrome is a pattern of passing and failing tests of the test suite, determining relative frequencies at which particular ones of the faults are coupled with particular ones of the syndromes; and 2) using the relative frequencies at which particular ones of the faults are coupled with particular ones of the syndromes to calculate and display to a user, via a graphical user interface, and for the test suite as a whole, test suite degrees of interference between pairs of the faults. Other embodiments are also disclosed.

36 Claims, 9 Drawing Sheets

| Prediction Table | | | | | |
|---|---|---|---|---|---|
|  | $Fault_1$ | $Fault_2$ | $Fault_3$ | ... | $Fault_n$ |
| $Syndrome_1$ | $frequency_{1,1}$ | $frequency_{1,2}$ | $frequency_{1,3}$ | ... | $frequency_{1,n}$ |
| $Syndrome_2$ | $frequency_{2,1}$ | $frequency_{2,2}$ | $frequency_{2,3}$ | ... | $frequency_{2,n}$ |
| $Syndrome_3$ | $frequency_{3,1}$ | $frequency_{3,2}$ | $frequency_{3,3}$ | ... | $frequency_{3,n}$ |
| ... | ... | ... | ... | ... | ... |
| $Syndrome_m$ | $frequency_{m,1}$ | $frequency_{m,2}$ | $frequency_{m,3}$ | ... | $frequency_{m,n}$ |

| Prediction Table |||||| 
|---|---|---|---|---|---|
| | $Fault_1$ | $Fault_2$ | $Fault_3$ | ... | $Fault_n$ |
| $Syndrome_1$ | $frequency_{1,1}$ | 0 | 0 | ... | 0 |
| $Syndrome_2$ | 0 | $frequency_{2,2}$ | 0 | ... | 0 |
| $Syndrome_3$ | 0 | 0 | $frequency_{3,3}$ | ... | 0 |
| ... | ... | ... | ... | ... | ... |
| $Syndrome_m$ | 0 | 0 | 0 | ... | $frequency_{m,n}$ |

FIG. 3

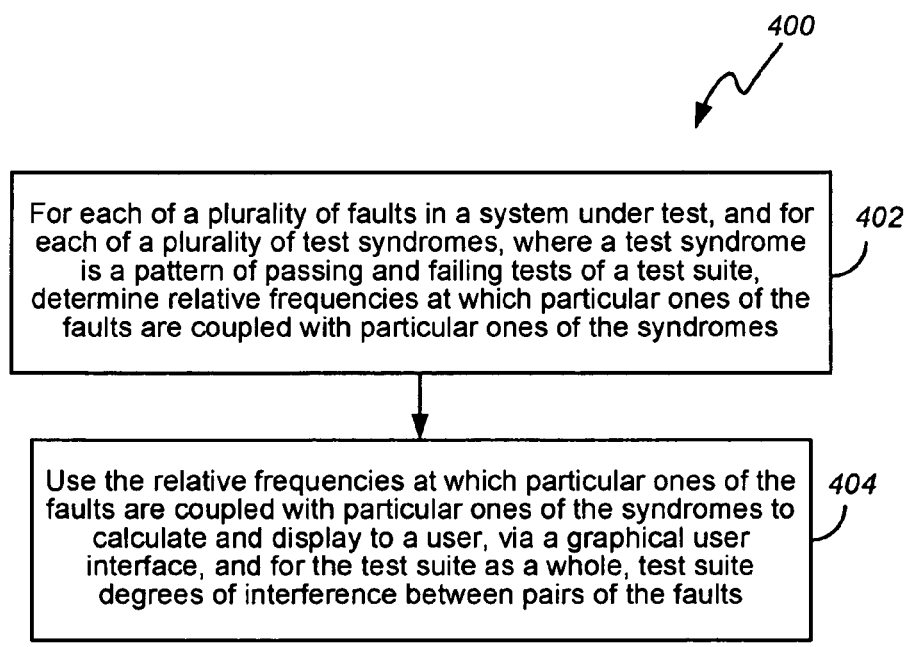

402 — For each of a plurality of faults in a system under test, and for each of a plurality of test syndromes, where a test syndrome is a pattern of passing and failing tests of a test suite, determine relative frequencies at which particular ones of the faults are coupled with particular ones of the syndromes 404 — Use the relative frequencies at which particular ones of the faults are coupled with particular ones of the syndromes to calculate and display to a user, via a graphical user interface, and for the test suite as a whole, test suite degrees of interference between pairs of the faults

FIG. 4

|  | $T_1$ | $T_2$ | $T_3$ | $T_4$ |
|---|---|---|---|---|
| $S_1$ | Pass | Pass | Pass | Pass |
| $S_2$ | Fail | Pass | Pass | Pass |
| $S_3$ | Pass | Fail | Pass | Pass |
| $S_4$ | Fail | Fail | Pass | Pass |
| $S_5$ | Pass | Pass | Fail | Pass |
| $S_6$ | Fail | Pass | Fail | Pass |
| $S_7$ | Pass | Fail | Fail | Pass |
| $S_8$ | Fail | Fail | Fail | Pass |
| $S_9$ | Pass | Pass | Pass | Fail |
| $S_{10}$ | Fail | Pass | Pass | Fail |
| $S_{11}$ | Pass | Fail | Pass | Fail |
| $S_{12}$ | Fail | Fail | Pass | Fail |
| $S_{13}$ | Pass | Pass | Fail | Fail |
| $S_{14}$ | Fail | Pass | Fail | Fail |
| $S_{15}$ | Pass | Fail | Fail | Fail |
| $S_{16}$ | Fail | Fail | Fail | Fail |

FIG. 5

| Prediction Table | | | | | |
|---|---|---|---|---|---|
|  | $F_1$ | $F_2$ | $F_3$ | $F_4$ | Total f |
| $S_1$ | 8 | 9 | 7 | 11 | 35 |
| $S_2$ | 102 | 0 | 13 | 97 | 212 |
| $S_3$ | 935 | 15 | 1 | 105 | 1056 |
| $S_4$ | 886 | 111 | 0 | 15 | 1012 |
| $S_5$ | 110 | 108 | 99 | 100 | 417 |
| $S_6$ | 111 | 20 | 17 | 863 | 1011 |
| $S_7$ | 92 | 12 | 7 | 9 | 207 |
| $S_8$ | 17 | 16 | 899 | 101 | 1033 |
| $S_9$ | 8 | 0 | 104 | 954 | 1066 |
| $S_{10}$ | 102 | 109 | 0 | 16 | 227 |
| $S_{11}$ | 700 | 886 | 7 | 1 | 1594 |
| $S_{12}$ | 900 | 927 | 0 | 11 | 1945 |
| $S_{13}$ | 12 | 101 | 13 | 104 | 230 |
| $S_{14}$ | 12 | 88 | 81 | 1 | 182 |
| $S_{15}$ | 1 | 102 | 932 | 13 | 1048 |
| $S_{16}$ | 1 | 6 | 120 | 101 | 228 |
| Total f | 3997 | 2510 | 2300 | 2406 | 11407 |

FIG. 6

| Prediction Table | | |
|---|---|---|
| Test Results | Component States | Frequency-of-Occurence |
| 000 | 100 | 317 |
| 000 | 010 | 304 |
| 000 | 001 | 290 |
| 100 | 100 | 2664 |
| 100 | 110 | 3 |
| 100 | 101 | 1 |
| 100 | 001 | 33 |
| 110 | 100 | 336 |
| 110 | 110 | 24 |
| 110 | 011 | 1 |
| 111 | 110 | 3 |
| 111 | 101 | 3 |
| 111 | 011 | 1 |
| 101 | 101 | 18 |
| 101 | 011 | 1 |
| 101 | 001 | 300 |
| 010 | 100 | 40 |
| 010 | 110 | 5 |
| 010 | 010 | 2682 |
| 010 | 011 | 2 |
| 011 | 110 | 1 |
| 011 | 010 | 259 |
| 011 | 011 | 23 |
| 001 | 101 | 2 |
| 001 | 010 | 38 |
| 001 | 011 | 4 |
| 001 | 001 | 2645 |

```
                                                                 ┌─ 1100
Walk the components of a system under test (SUT) model
      Generate a fault list containing component combinations of interest
                                                          ╲
For each fault in the list                                  ╲ 1102
 ╲      For N number of runs
  ╲1104       For each component in the fault
                    For each joint coverage of the component
                          Simulate the probability of that joint coverage detecting
                             the component as bad
                          Add detections to a joint coverages list for this
                             component
                    End
                    For each test that covers the component either directly or jointly
                          Simulate the probability of that test detecting the
                             component as bad (factoring in the joint coverages that
                             apply)
                          Add the test result to the syndrome
                    End
              End
              If this is a new syndrome for the current fault then
                    Add the syndrome to the prediction table with frequency 1 for
                       this fault
              Else
                    Increment the frequency count for the syndrome for this fault
                       in prediction table
              End
End
        ┌─ 1106
For each column (Fault) in the prediction table
        Calculate the relative probability of failure (based on component failure rates)
        For each row (Syndrome) in the prediction table
              Scale the syndrome frequency based on the relative probability of
                 failure
        End
End
```

FIG. 11

| Individual Fault Analysis 1200 ||||
|---|---|---|---|---|
| Fault | Relative Frequency | Detection | Isolation | No. Interfering Faults |
| $F_1$ | 35.0% | 99.8% | 35.6% | 3 |
| $F_2$ | 22.0% | 99.6% | 25.3% | 3 |
| $F_3$ | 21.8% | 99.7% | 28.3% | 3 |
| $F_4$ | 21.1% | 99.5% | 21.4% | 3 |

FIG. 12

| Ambiguity Group for $F_2$ 1300 ||
|---|---|
| Interfering Fault | Test Suite Degree of Interference |
| $F_1$ | 61.9% |
| $F_3$ | 14.6% |
| $F_4$ | 12.8% |

FIG. 13

| Shared Syndromes for $F_2$ and $F_1$ 1400 ||||||
|---|---|---|---|---|---|---|
|  | $S_3$ | $S_4$ | $S_5$ | . . . | $S_8$ | . . . |
| Syndrome Frequency | 1056 | 1012 | 417 | . . . | 937 | . . . |
| Syndrome Degree of Interference | 3.2% | 22.2% | 99.1% | . . . | 97.1% | . . . |
| $T_1$ | Pass | Fail | Pass | . . . | Fail | . . . |
| $T_2$ | Fail | Fail | Pass | . . . | Fail | . . . |
| $T_3$ | Pass | Pass | Fail | . . . | Fail | . . . |
| $T_4$ | Pass | Pass | Pass | . . . | Pass | . . . |

FIG. 14

METHODS AND APPARATUS FOR DIAGNOSING A DEGREE OF INTERFERENCE BETWEEN A PLURALITY OF FAULTS IN A SYSTEM UNDER TEST

BACKGROUND

A wide variety of systems including mechanical, electrical and chemical systems as well a combinations thereof are commonly tested under a variety of environments including manufacturing test environments and field support environments. These systems include electronic systems such as circuit boards, and full systems having a variety of circuit boards. These systems also include automobiles, satellite systems, and test equipment. Such a system, while undergoing a test cycle, may be referred to as a system under test.

A system under test typically includes a variety of components. Such components include, for example, integrated circuit devices, electrical components, battery systems, mechanical components, electrical buses, wiring components, and wiring harness and backplane components. Any one or more of these components may fail and thereby cause a failure of the system under test.

Prior diagnostic systems for determining likely failed components in a system under test include model-based diagnostic systems. A model-based diagnostic system may be defined as a diagnostic system that renders conclusions about the state of the system under test, using actual system under test responses from applied tests as an input to the diagnostic system. Such a diagnostic system is usually based upon computer generated models of the system under test and its components, as well as the diagnostic process.

It is usually desirable to employ a model-based diagnostic system that is based upon a more manageable model of system under test characteristics. Such a model-based diagnostic system usually minimizes the amount of modeling information for a system under test that must be generated by a user before the system can be applied to the system under test. Such modeling usually speeds the process of adapting the diagnostic system to differing systems under test, and increases confidence in the determinations rendered by the diagnostic system.

U.S. Pat. No. 5,808,919 of Preist et. al. discloses a model-based diagnostic system, based on functional tests, in which the modeling burden is greatly reduced. The model disclosed in Preist et. al. employs a list of functional tests, a list of components exercised by each functional test, along with the degree to which each component is exercised by each functional test, and (if available) the historical or a priori failure rate for individual components. Such model data may be rapidly and easily determined or estimated by test engineers, test programmers or others familiar with, but not necessarily expert on, a system under test. Typically, the models may be developed by test engineers in a few days to a few weeks depending on the complexity of the system under test.

Sometimes, a test engineer may desire to use a model-based diagnostic system such as that which is disclosed by Priest et. al. to determine whether a fault is detectable or diagnosable. A "fault" represents one or more components or sub-components that are behaving abnormally causing one or more tests in a test suite to fail. A "detectable fault" is one that causes at least one test in a test suite to fail. A "diagnosable fault" is one that can be uniquely identified given an ambiguity group comprised of faults that all cause the same test (or group of tests) to fail. Thus, even when a particular fault is detectable, it may be difficult to diagnose it as the root cause of a test failure, because other faults may tend to cause the same test failure and thereby "interfere" with the ability to diagnose the particular fault as the root cause of a test failure.

U.S. Pat. No. 5,922,079 of Booth et. al. discloses methods for automatically analyzing a model-based diagnostic system, such as that which is disclosed by Priest et. al., to identify detectability and diagnosability problems of faults. However, the methods disclosed by Booth et. al., taken alone, do not always provide enough information regarding a diagnosability problem. Thus, the methods disclosed by Booth et. al. may tell a user that a diagnosability problem exists, but may not always provide the user with enough information to fully assess or troubleshoot the diagnosability problem.

SUMMARY OF THE INVENTION

In one embodiment, a method for diagnosing a degree of interference between a plurality of faults in a system under test, wherein the faults are detected by means of applying a test suite to the system under test, comprises: 1) for each of the plurality of faults, and for each of a plurality of test syndromes (where a test syndrome is a pattern of passing and failing tests of the test suite), determining relative frequencies at which particular ones of the faults are coupled with particular ones of the syndromes; and 2) using the relative frequencies at which particular ones of the faults are coupled with particular ones of the syndromes to calculate and display to a user, via a graphical user interface, and for the test suite as a whole, test suite degrees of interference between pairs of the faults.

In another embodiment, a method for diagnosing a degree of interference between a plurality of faults in a system under test, wherein the faults are detected by means of applying a test suite to the system under test, comprises: 1) for each of the plurality of faults, and for each of a plurality of test syndromes (where a test syndrome is a pattern of passing and failing tests of the test suite), determining relative frequencies at which particular ones of the faults are coupled with particular ones of the syndromes; and 2) using the relative frequencies at which particular ones of the faults are coupled with particular ones of the syndromes to calculate and display to a user, via a graphical user interface, and for particular syndromes, syndrome degrees of interference between pairs of the faults.

Other embodiments are also disclosed.

BRIEF DESCRIPTION OF THE DRAWINGS

Illustrative embodiments of the invention are illustrated in the drawings, in which:

FIG. 3 illustrates an exemplary prediction table for a test suite that provides for ideal fault diagnosability;

FIG. 4 illustrates a second exemplary method for diagnosing a degree of interference between a plurality of faults in a system under test;

FIG. 5 illustrates the sixteen possible test syndromes $\{S_1 \ldots S_{16}\}$ that can be exhibited by executing a test suite having four tests $\{T_1, T_2, T_3, T_4\}$ on a system under test;

FIG. 6 illustrates an exemplary prediction table containing simulated frequencies at which the faults $\{F_1, F_2, F_3, F_4\}$ are associated with the syndromes $\{S_1 \ldots S_{16}\}$;

FIG. 11 illustrates a second exemplary method for performing the simulation via the statistical simulator shown in FIG. 7; and FIGS. 12-14 illustrate exemplary dialogs that may be displayed via a graphical user interface of the device tester shown in FIG. 7.

DETAILED DESCRIPTION

The methods and apparatus disclosed herein can be used to better assess or troubleshoot a diagnosability problem. A diagnosability problem exists when two or more faults belong to an ambiguity group. An "ambiguity group" is a group of faults that could each, individually, explain a test syndrome. A "test syndrome" is a pattern of passing and failing tests of a test suite.

Assuming that a given fault in an ambiguity group is the root cause of a test syndrome, the methods and apparatus disclosed herein calculate "degrees of interference" between the given fault and other faults in the ambiguity group, with respect to diagnosing the given fault as the root cause of the test syndrome. In addition, the test syndromes that are shared by two or more interfering faults can be identified and presented to a user, to provide insight into where improvements can be made to a test suite to improve fault diagnosability.

Figures 1, 2:
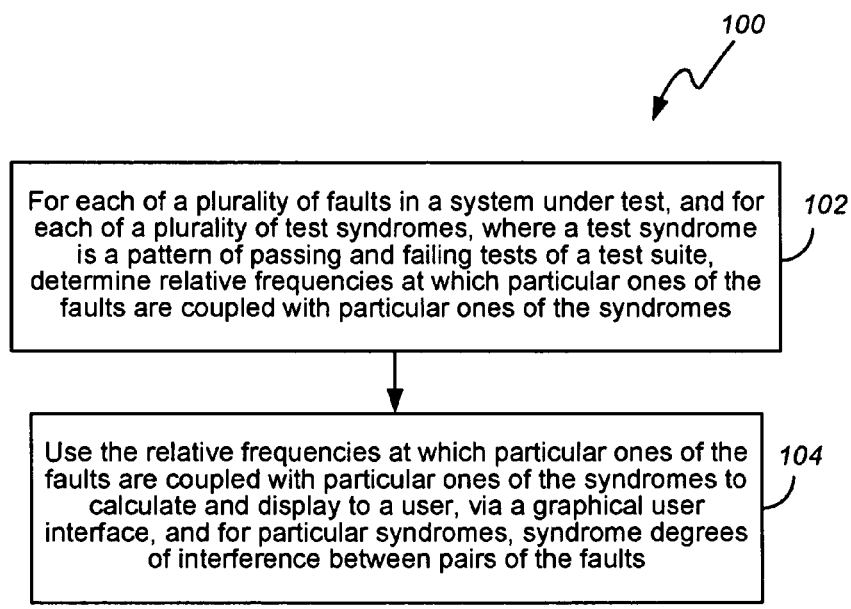
FIG. 1 illustrates a first exemplary method for diagnosing a degree of interference between a plurality of faults in a system under test.
FIG. 2 illustrates an exemplary matrix of faults versus test syndromes (or prediction table) that may be generated as a byproduct of determining the relative frequencies at which particular ones of the faults are coupled with particular ones of the syndromes (as shown in FIG. 1)

FIG. 1 illustrates a first exemplary method 100 for diagnosing a degree of interference between a plurality of faults in a system under test (with the faults being detected by means of applying a test suite to the system under test—either through actual testing or simulated testing). The method 100 comprises, for each of the plurality of faults, and for each of a plurality of test syndromes, determining relative frequencies at which particular ones of the faults are coupled with particular ones of the syndromes (see block 102). The relative frequencies at which particular ones of the faults are coupled with particular ones of the syndromes are then used to calculate and display to a user, via a graphical user interface, and for particular syndromes, "syndrome degrees of interference" between pairs of the faults (see block 104).

As a byproduct of determining the relative frequencies at which particular ones of the faults are coupled with particular ones of the syndromes, a matrix of faults versus test syndromes (or prediction table) may be generated as shown in FIG. 2. In such a matrix, the intersection of a particular fault (Fault$_x$) and a particular syndrome (Syndrome$_y$) provides the relative frequency ($f_{x,y}$) at which the particular fault is coupled with the particular syndrome. Of note, a test suite that provides for ideal fault diagnosability would only have non-zero frequency entries along its diagonal, as shown in FIG. 3. Such an ideal case is, however, rarely encountered in the real world.

In one embodiment of the method 100, the relative frequencies at which particular ones of the faults are coupled with particular ones of the syndromes are determined by performing a statistical simulation of executing the tests of a test suite on the components of a system under test. In this manner, the "syndrome degrees of interference" may be calculated in the absence of historical test data. However, if historical test data is available, this data may be used in addition (or in lieu of) statistical simulation data.

A particular syndrome degree of interference ($DOI_s$) between a pair of faults $F_1$ and $F_2$ may, in one embodiment, be calculated as:

$$DOI_s(F_1, F_2) = c^*[\min(f_{s,1}, f_{s,2})]/(f_{s,1}+f_{s,2}); \quad (1)$$

where S is a particular syndrome, c is a constant, $f_{s,1}$ is the relative frequency at which the fault $F_1$ is coupled with the syndrome S, $f_{s,2}$ is the relative frequency at which the fault $F_2$ is coupled with the syndrome S, and $\min(f_{s,1}, f_{s,2})$ is a function that determines the minimum of $f_{s,1}$ and $f_{s,2}$. If the constant, c, is set to 2, then the degree of interference, $DOI_s(F_1, F_2)$, scales to a value between 0% and 100%. This makes the degree of interference an easy to understand quantity. When two faults are both associated with the same syndrome to the same degree, then the resulting "syndrome degree of interference" between the two faults is 100%.

FIG. 4 illustrates a second exemplary method 400 for diagnosing a degree of interference between a plurality of faults in a system under test (with the faults being detected by means of applying a test suite to the system under test—either through actual testing or simulated testing). The method 400 is in many ways similar to the method 100, and comprises: for each of the plurality of faults, and for each of a plurality of test syndromes, determining relative frequencies at which particular ones of the faults are coupled with particular ones of the syndromes (see block 402). However, in contrast to the method 100, the relative frequencies at which particular ones of the faults are coupled with particular ones of the syndromes are used to calculate and display to a user, via a graphical user interface, and for the test suite as a whole, "test suite degrees of interference" between pairs of the faults (see block 404).

A particular test suite degree of interference ($DOI_{Test\,Suite}$) between a pair of faults $F_1$ and $F_2$ may, in one embodiment, be calculated as:

$$DOI_{Test\,Suite}(F_1, F_2) = \Sigma_{All\,S}[c^*[\min(f_{s,1}, f_{s,2})]]/ \Sigma_{All\,S}(f_{s,1}+f_{s,2}); \quad (2)$$

where S is a particular syndrome, c is a constant, $f_{s,1}$ is the relative frequency at which the fault $F_1$ is coupled with the syndrome S, $f_{s,2}$ is the relative frequency at which the fault $F_2$ is coupled with the syndrome S, and $\min(f_{s,1}, f_{s,2})$ is a function that determines the minimum of $f_{s,1}$ and $f_{s,2}$. As with the method 100, the constant, c, may be set to 2 so that the degree of interference, $DOI_{Test\,Suite}(F_1, F_2)$, scales to a value between 0% and 100%.

Use of the exemplary equations (1.) and (2) for determining degrees of interference (DOI) are best illustrated with a simple example of a system under test having four components $\{C_1, C_2, C_3, C_4\}$ and a test suite having four tests $\{T_1, T_2, T_3, T_4\}$. For simplicity, each component $C_x$ will be considered to be associated with only a single fault $F_x$, thereby yielding the faults $\{F_1, F_2, F_3, F_4\}$. However, it should be noted that in real world examples a component can in some cases be associated with multiple faults, a fault can in some cases be associated with multiple components (i.e., a multiple component fault).

In the above example, the four tests $\{T_1, T_2, T_3, T_4\}$ yield sixteen ($2^4$) possible test syndromes $\{S_1 \ldots S_{16}\}$ that can be exhibited by the system under test. See FIG. 5. Although the test syndrome $S_1$ is shown, this syndrome is typically excluded from degree of interference calculations, because it represents a "No Fault" syndrome.

FIG. 6 illustrates an exemplary prediction table containing 1) simulated frequencies at which the faults $\{F_1, F_2, F_3, F_4\}$ are associated with the syndromes $\{S_1 \ldots S_{16}\}$, 2) relative frequencies at which each fault appears for all syndromes in the test suite (i.e., "Total f" for each column), and 3) relative frequencies at which each of the shared syndromes appears for all faults in the test suite (i.e., "Total f" for each row). Given this data, the degree of interference between faults $F_1$ and $F_2$ for the syndrome $S_{12}$ is 98.52%, calculated as follows:

$$DOI_S(F_1, F_2) = 2^*[\min(900, 927)]/(900 + 927) \quad (3)$$
$$= 2^*900/1827$$
$$= 98.52\%;$$

The degree of interference between faults $F_1$ and $F_3$ for the syndrome $S_{12}$ is 0%, calculated as follows:

$$DOI_s(F_1, F_3) = 2^*[\min(900, 0)]/(900+0) = 2^*0/900 = 0\%; \quad (4)$$

The degree of interference between faults F1 and F2 with respect to the test suite as a whole is 61.9%, calculated as follows:

$$DOI_{Test\ Suite}(F_1, F_2) = 2^*[\min(102, 0) + \min(935, 15) + \quad (5)$$
$$\min(886, 111) + \min(110, 108) +$$
$$\min(111, 20) + \min(92, 12) +$$
$$\min(17, 16) + \min(8, 0) +$$
$$\min(102, 109) + \min(700, 886) +$$
$$\min(900, 927) + \min(12, 101) +$$
$$\min(12, 88) + \min(1, 102) +$$
$$\min(1, 6)]/[(102 + 0) + (935 + 15) +$$
$$(866 + 111) + (110 + 108) +$$
$$(111 + 20) + (92 + 12) + (17 + 16) +$$
$$(8 + 0) + (102 + 109) + (700 + 886) +$$
$$(900 + 927) + (12 + 101) +$$
$$(12 + 88) + (1 + 102) + (1 + 6)]$$
$$= 2^*1999/6480$$
$$= 64.9\%;$$

The methods 100 and 400 can be implemented by a computer, including one that is a part of or associated with a device tester 702 (FIG. 7), in response to the execution of computer-readable program code stored on computer-readable media. The computer-readable media may include, for example, any number or mixture of fixed or removable media (such as one or more fixed disks, random access memories (RAMs), read-only memories (ROMs), or compact discs), at either a single location or distributed over a network. The computer-readable program code may include, for example, instructions embodied in software or firmware.

Figure 7:
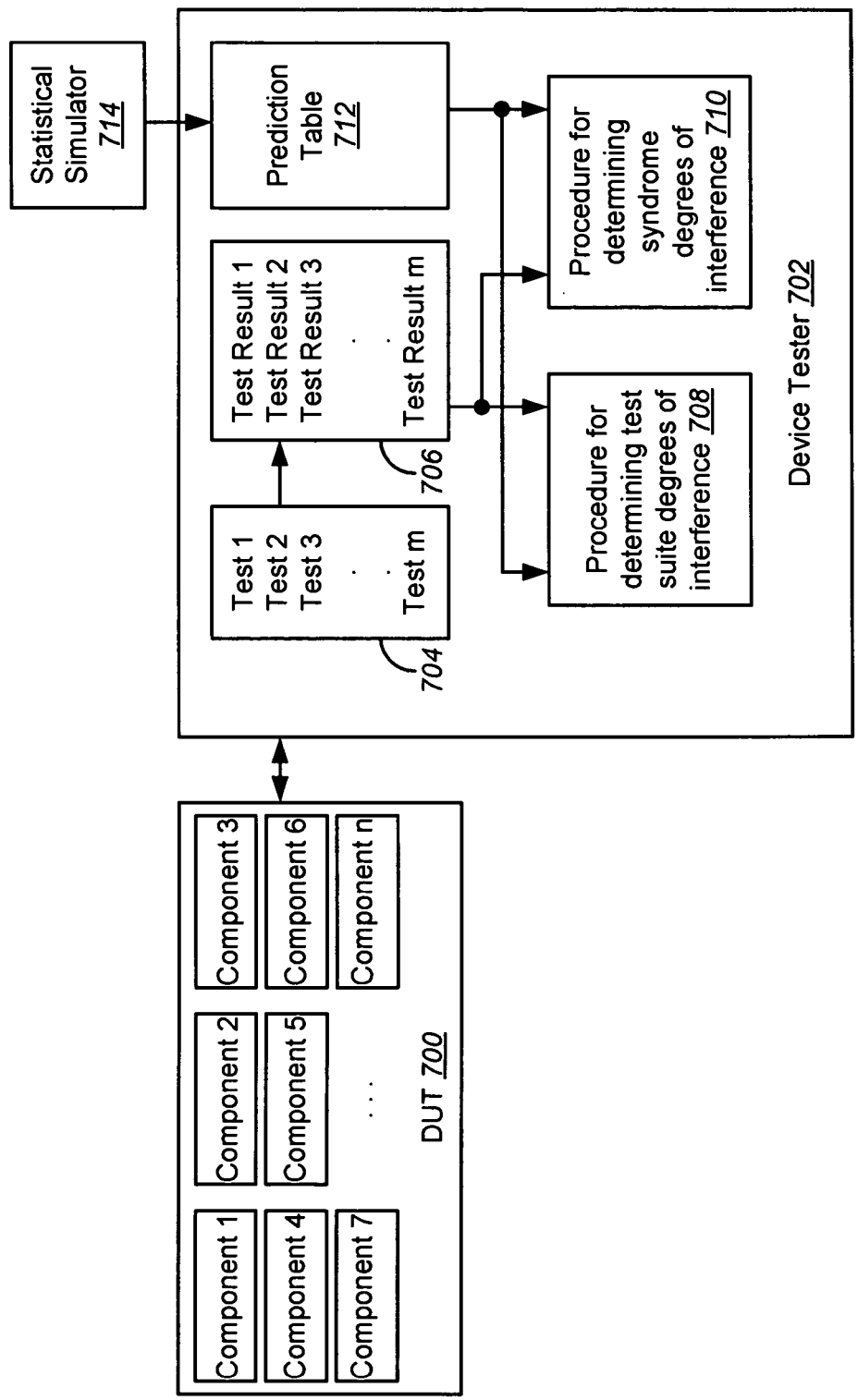
FIG. 7 illustrates an exemplary embodiment of a device tester for executing the methods shown in FIGS. 1 & 4.

FIG. 7 illustrates an exemplary embodiment of a device tester 702 for executing the methods 100 and 400. The device tester 702 is coupled to a system under test 700 which may take a variety of forms, including that of a mechanical, electrical or chemical system, or a combination of some or all of these types of systems.

The system under test 700 includes, and is modeled as, a set of components 1-$n$, each of which may be associated with (or exhibit) one or more faults. A "component" may be any structural item of a system under test, ranging from the simplest to most complex element. The connotation to be given the term "component" in any given system under test 700 depends on the level to which it is desirable to be able to diagnose faults. For example, on a circuit board, it might be desirable to be able to diagnose faults down to the level of resistors and capacitors, so that faulty ones of these elements can be replaced. In this case, the resistors and capacitors might be components. Alternatively, on a multi-chip module, it might be desirable to diagnose faults down to the chip level, such that chips would be components; and, for a single microchip, it might be desirable to diagnose faults down to functional blocks or even individual transistors of the microchip, such that functional blocks or transistors are components. Or, in a computer network, it might be satisfactory to diagnose faults down to the level of a computer on the network, such that computers are components.

The device tester 702 includes the mechanisms that are necessary to 1) impart a stimulus or multiple stimuli to the system under test 700, and 2) measure a response to the stimuli. Such test mechanisms may include electrical circuitry for generating electrical signals and measuring electrical response signals, as well as mechanisms for generating mechanical or chemical stimulus and measuring mechanical or chemical responses, depending upon the nature and function of the system under test 700.

The device tester 702 further includes mechanisms to execute a test suite 704. The test suite 704 is modeled as a plurality of tests, 1-$m$, that pass or fail based on one or more of the components 1-$n$ exhibiting their associated faults when the tests 1-$m$ are executed so as to generate the stimuli that are applied to the system under test 700. The results of executing the tests 1-$m$ on the system under test 700 may be stored in a test result table 706 as test results 1-$m$. In this manner, the test result table 706 indicates 1) which of the tests 1-$n$ have been applied to the system under test 700, and 2) which of the tests 1-$m$ have passed or failed.

The tester 702 may also include a computer or equivalent mechanism for performing the procedure 708 (which determines test suite degrees of interference) and the procedure 710 (which determines syndrome degrees of interference). The procedures 708 and 710 may be embodied in application software for any one of a wide variety of available computer system platforms, or they may be embodied as diagnostic code that executes on a hardware computing platform designed specifically for the device tester 702. The application software or diagnostic code as well as the contents of the prediction table 712 may be embedded within a persistent store in the device tester 702 or may be downloaded into memory within the device tester 702 via a variety of suitable communication mechanisms.

The tester 702 further includes a mechanism, such as a graphical display, to display a graphical user interface via which the degrees of interference determined by procedures 708 and 710 may be displayed to a user.

For the purposes of the techniques disclosed herein, each of the components 1-$n$ is either in a good state (GOOD) or a bad state (BAD). It is assumed that the components 1-$n$ do not transition between the good and bad states during the course of a test cycle.

Each of the tests 1-$m$ may be modeled as covering some portion of the set of faults exhibited by the components 1-$n$ (i.e., based on each test's ability to detect one or more of the faults). The subsets of components acted upon or covered by a particular test 1-*m* may overlap with subsets covered by other of the tests 1-*m*. If a particular test 1-*m* fails, it is assumed that at least one of the components 1-*n* covered by that particular test is bad. Each test 1-*m* either passes or fails when applied to the system under test 700. If a particular test of the tests 1-*m* generates a finite number of test results, then that particular test is treated as a number of tests, each with only two possible results, pass or fail.

Each test result 1-*m* includes 1) an indication of whether the corresponding test 1-*m* passed (PASS) or failed (FAIL), and 2) an indication of whether the corresponding test 1-*m* has been applied to the system under test 700 during a current test cycle. The subset of the tests 1-*m* that have been applied to the system under test 700 at a particular point in a test cycle are referred to as applied tests. The results of the applied tests are indicated in the current state of the test result table 706.

The prediction table 712 contains the numbers of occurrences of the test results for any probable test results and probable bad components jointly. In one embodiment, the prediction table 712 contains simulated experimental data generated by a statistical simulator 714. The statistical simulator 714 may be implemented on a separate computer system or may be implemented within the device tester 702. The use of a statistical or a Monte Carlo approach to produce the simulated experimental data in the prediction table 712 eliminates the need to produce real experimental data that would otherwise require years of collecting test results from real test systems and real world situations.

In an alternative embodiment, the prediction table 712 contains actual experimental data reflecting actual prior test results and component failures from historical test data. In other embodiments, the prediction table 712 data may be based on a failure mode affects analysis.

Hereinafter, the term "random number" is meant to include the output of pseudo-random number generators as well as numbers chosen through some truly stochastic physical process.

The input to the statistical simulator 714 is a model of the capability of each the tests 1-*m* in locating bad components among the components 1-*n*. The model input to the statistical simulator 714 is given by the number of the component 1-*n*, the number of tests 1-*m*, and shared or joint coverages of the tests 1-*m* on the components 1-*n*, and for each component i, its statistical probability of failure, p(i). The coverage of test j on component i is referred to as cov(i,j). Each coverage cov(i,j) is a real number between 0 and 1, inclusive, and is a fraction of the functionality of component i that is checked by test j.

The joint coverages specify known dependencies among the tests 1-*m*. A joint coverage arises when two or more of the tests 1-*m* have some coverage that tests one of the components 1-*n* in the exactly the same way. An example of a joint coverage is when two or more of the tests 1-*m* performed by the device tester 702 use the same measurement subroutine with the same parameters.

A joint coverage k is specified by a list of the tests 1-*m* that use the joint coverage k and for each component i the amount of joint coverage k has on i. The amount of joint coverage k has on i is denoted as jcv(i,k) and is a number between 0 and 1 inclusive.

The prediction table 712 contains a set of entries each having a field for a frequency-of-occurrence value, a field for a test result pattern, and a field for a component state pattern. In one embodiment, each frequency-of-occurrence value indicates the number of times the corresponding patterns of component states and test results occurred during the course of the simulation performed by the statistical simulator 714. In an alternative embodiment, each frequency-of-occurrence value indicates the number of times the corresponding patterns of component states and test results actually occurred during the course of prior tests on similar systems. Each entry in the prediction table 712 corresponds to a unique pattern of test results and component states.

Figure 8:
FIG. 8 shows exemplary entries for the prediction table shown in FIG. 7, in an embodiment where m=n=3.

FIG. 8 shows exemplary entries for the prediction table 712, in an embodiment wherein n=3 and m=3.

The component state, GOOD or BAD, for each component 1-*n* is represented by a single bit (0 or 1). Patterns of test results are indicated by a string of bits that represent the PASSED or FAILED results of the tests 1-*m*. Each test result is represented by a single bit (0 or 1) for each of the tests 1-*m*.

The values in the frequency-of-occurrence field indicate the number of times the corresponding pair of component state and test result patterns occurred during the course of the simulation performed by the statistical simulator 714 or during actual prior test runs. For example, the test result pattern 000 paired with the component failure pattern 100 occurred 317 times, while the test result pattern 000 paired with the component failure pattern 010 occurred 304 times during the simulation or the prior tests.

Each pattern of component states (or syndrome) and each pattern of test results appears separately in the prediction table 712 more than once. Each pair of component states and test results appear together in the table 712 at most once. As a consequence, the test result and component failure fields together provide the key of the prediction table 712.

Figure 9:
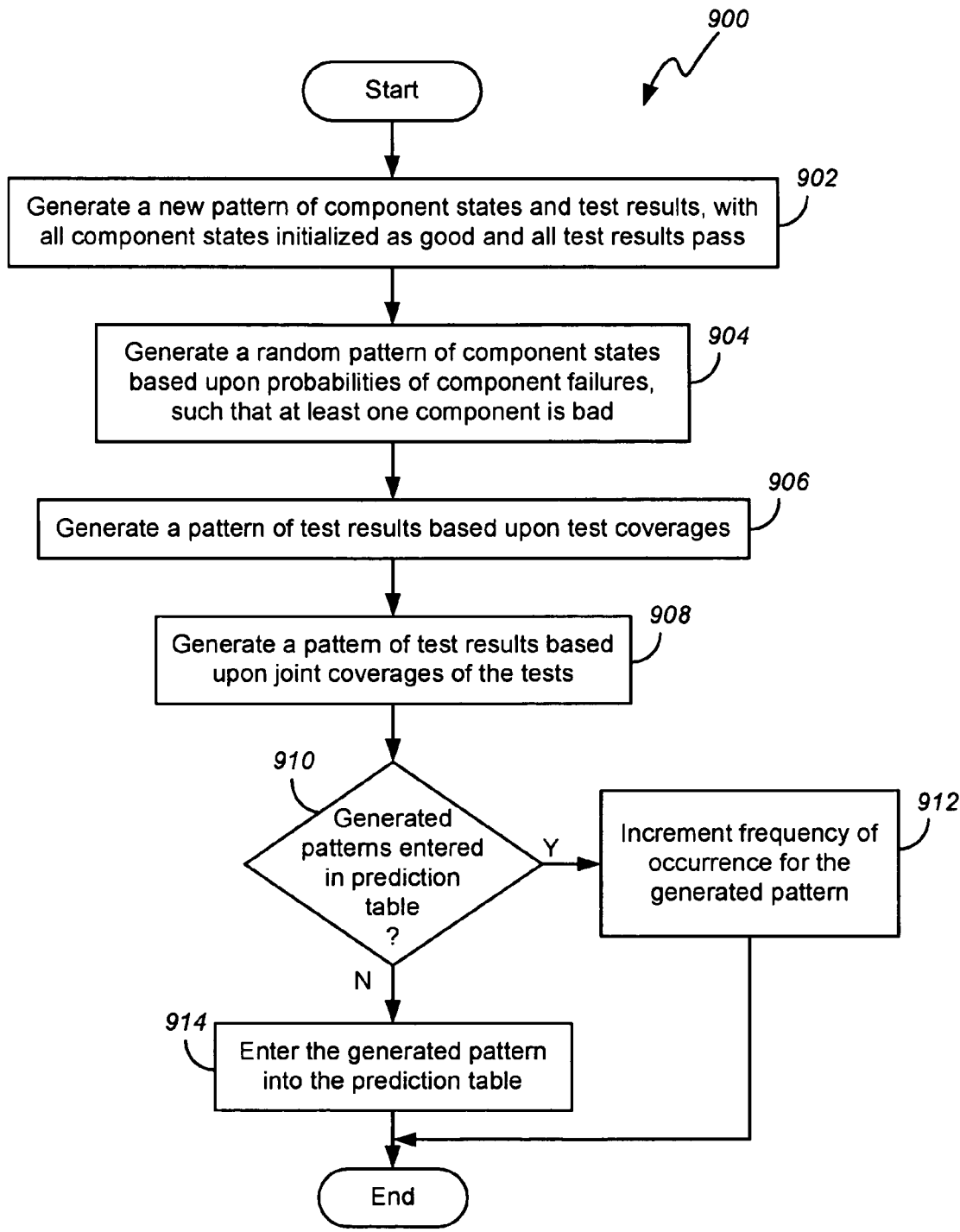
FIG. 9 illustrates an exemplary method for performing a simulation via the statistical simulator shown in FIG. 7.

FIG. 9 illustrates a first example 900 of the simulation that could be performed by the statistical simulator 714. The simulation 900 is set forth as steps 902, 904, 906, 908, 910, 912 and 914, which are repeatedly performed for a large predetermined number of times (T).

The statistical simulator 714 need only be run one time for a given model of the system under test 700, the components 1-*n*, and the tests 1-*m*. Thus, the work of diagnosis is divided into a preprocessing part which is done once only, and efficient decision procedures 708 and 710 that are performed for each system under test.

At step 902, a new pattern of component states is generated in which each state is initialized to "GOOD" and a new pattern of test results is generated in which each result is initialized to "PASS".

The pattern of component states generated at step 902 is modified by setting the component state for each component i to "BAD" with probability p(i). The a priori probability p(i) in one embodiment is a n engineering estimate of the probability of failure of the component i. In another embodiment, the probabilities p(1)-p(n) provide a relative indication of the probabilities of failure among components 1-*n*.

It is assumed that no diagnosis will be performed unless at least one test has failed. It is also assumed that a test will fail only if at least one component is bad. Consequently, there is no reason to put an entry into the prediction table 712 unless its pattern of component states contains at least one "BAD".

Therefore, a random pattern of component states is generated at step 904 such that the random pattern of component states contains at least one "BAD" indication. In one embodiment, the state of each component i in the list of components is set to "BAD" with probability p(i). The resulting pattern of component states is then checked to determine whether it contains at least one "BAD." If the resulting pattern of component states does not contain at least one "BAD" then it is discarded and another pattern is generated. This process is repeated until a sufficient number of patterns of component states each containing at least one "BAD" has been generated. Since the probability p(i) that the state of a given component will be "BAD" is generally much closer to zero than to one, the process just described will typically generate many all-"GOOD" patterns of component states for each pattern of component states containing at least one "BAD." Consequently, the process just described does not make efficient use of available computer power or time.

Figure 10:
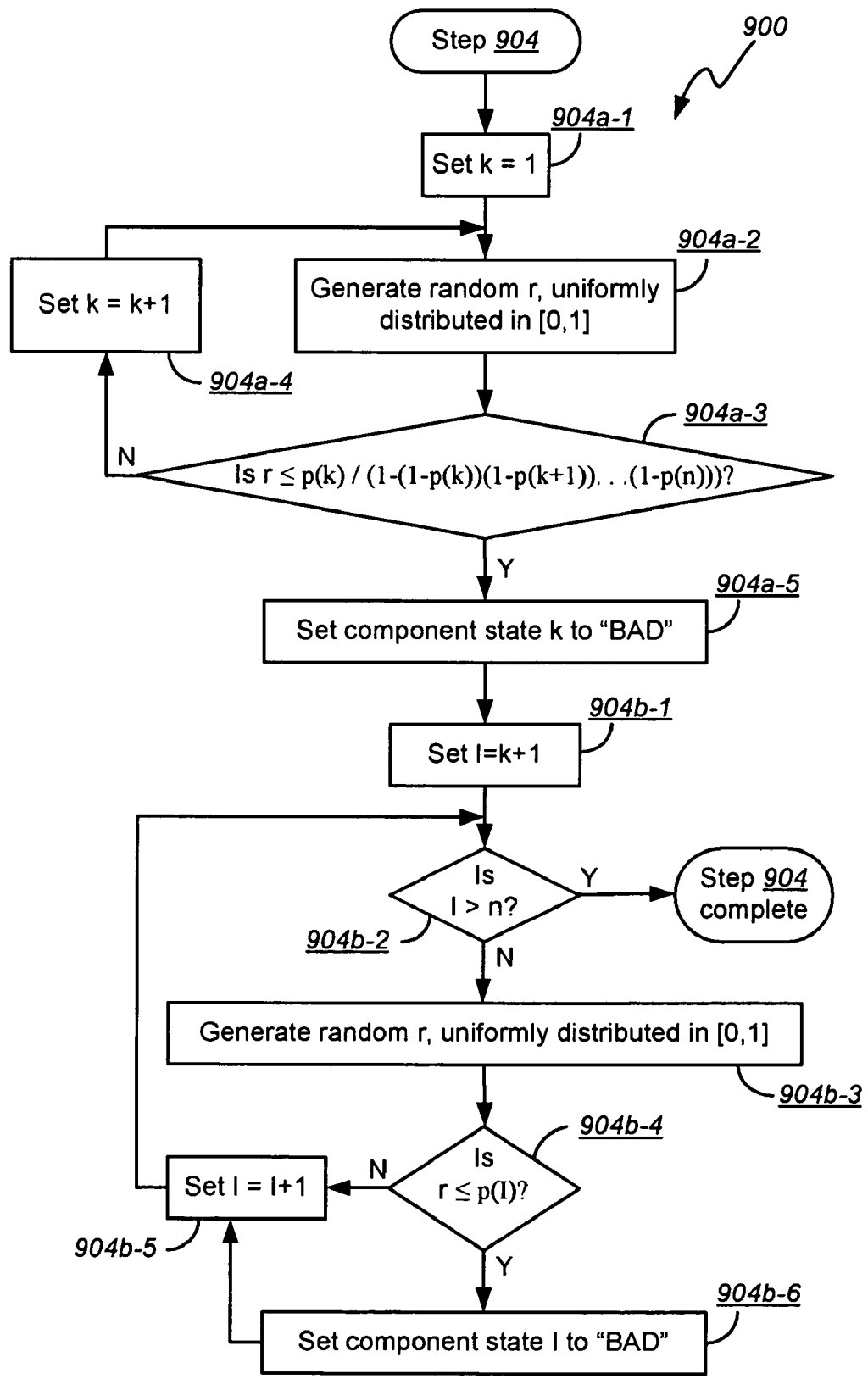
FIG. 10 illustrates a process for generating patterns of component states that requires only a single pass through the list of components to generate a pattern of component states that contains at least one "BAD" (in accord with the method shown in FIG. 9)

FIG. 10 illustrates a process for generating patterns of component states that requires only a single pass through the list of components to generate a pattern of component states that contains at least one "BAD." The process operates in two phases which are shown as steps 904a-1 through 904a-5 and steps 904b-1 through 904b-6, respectively. The first phase steps through the list of components and assigns the state "BAD" to each component with an enhanced probability. The enhanced probability is computed both to guarantee that at least one "BAD" component state is generated in each pass through the list of components, and to guarantee that the overall probability of assigning the state "BAD" to component i remains p(i). The first phase ends once the state "BAD" has been assigned to one component, and the second phase begins. The second phase steps through the remainder of the component list, and assigns the state "BAD" to the component i with the original, un-enhanced probability p(i).

Step 904a-1 through 904a-5: For k=1 to n; generate a uniformly-distributed random number r between 0 and 1. If $r \leq p(k)/(1-(1-p(k))*(1-p(k+1))* \ldots *(1-p(n)))$, then set the state of component k to "BAD," and go to step 904b-1.

Step 904b-1 through 904b-6: For I=k+1 to n; generate a uniformly distributed random number r between 0 and 1. If $r \leq p(1)$, then set the state of component I to "BAD".

Note that the value of $p(k)/(1-(1-p(k))*(1-p(k+1))* \ldots *(1-p(n)))$ for each possible value of k between 1 and n can be computed once for a particular system under test and can then be stored for rapid access when needed in step 904a.

At step 906, a pattern of test results is generated based upon test coverages. Assume an unsigned integer variable may contain values from 0 to $2^N-1$, inclusive, for some machine-dependent integer N. Step 906 is performed according to the following steps for each component j to which state "BAD" was assigned in step 904, for each test i:

Generate a uniformly distributed random number r in the range $2^N-1$.

If $(r+floor(cov(i,j)*(2^N-1))) \bmod 2^N < r$, where floor(x) is the greatest integer less than or equal to x, then set test result of test i to FAIL. (Note that the values floor(cov(i,j)*($2^N-1$)) can be computed once, after the inputs are read but before the simulations are begun. Note that the modulo $2^N$ operation is the usual result of overflow in binary addition, and so it never needs to be computed).

At step 908, a pattern of test results based upon the joint coverages of the tests 1-m is generated. Step 908 is performed according to the following steps for each joint coverage i, for each component j to which the state "BAD" was assigned in step 904:

Generate a uniformly distributed random unsigned integer r in the range 0 to $2^n-1$ inclusive.

If $(r+floor(jcv(i,j)*(2^n-1))) \bmod 2^n < r$ then for each test k that uses joint coverage i, set the test result of test k to FAIL.

At step 910, it is determined whether there is an entry in the prediction table 712 for the pattern of test results and the pattern of component states generated in steps 902 through 908.

If there is such an entry, then the frequency-of-occurrence field for that entry in the prediction table 712 is incremented by 1 at step 912. If there is no such entry, then the entry is created and added to the prediction table 712 with the frequency-of-occurrence initialized to 1 at step 914.

FIG. 11 illustrates a second example 1100 of the simulation that could be performed by the statistical simulator 714. The exemplary simulation 1100 is illustrated via pseudo-code. In accord with the pseudo-code 1100, potential faults of interest are first enumerated (1102). One simple way to do this is to enumerate all single and double component faults for a system under test. Test patterns (i.e., test syndromes) are then generated much the same as in FIGS. 9 & 10, but for a fixed (but statistically significant) number of runs (e.g., 100 to 1000 runs) for each enumerated fault (1104). This is typically more efficient than generating test patterns for all faults. Thereafter, the syndrome frequencies for each fault are scaled based on the relative a priori failure rates of the components of each fault of interest (1106). This gives better overall statistical resolution when failure rates are disparate (as compared to the simulation illustrated in FIGS. 9 & 10).

Of note, the prediction table 712 need not be stored exactly as depicted in FIG. 8. For example, it could be easily translated to (or generated in) the form depicted in FIG. 6. Furthermore, there are various tree storage, indexing, hashing, and data compression techniques that may reduce the amount of memory required to store the prediction table 712 and/or speed access to the values stored in the prediction table 712. These techniques and the criteria for choosing among them based on their relative advantages in particular situations are well known to those skilled in the art of design of computer algorithms, data structures, and programs.

FIGS. 12-14 illustrate exemplary dialogs 1200, 1300, 1400 that may be displayed via the graphical user interface of the device tester 702. The "Individual Fault Analysis" dialog 1200 shown in FIG. 12 includes a list of faults $\{F_1, F_2, F_3, F_4\}$ for a system under test 700. Optionally, relative frequencies at which each fault appears for all syndromes in the test suite may be displayed in the dialog 1200. Also optionally, one or more of the following (or other variables) may be displayed in the dialog 1200: the detectability performance of the test suite for each fault, the diagnosability performance of the test suite for each fault, and the number of faults that interfere with each fault. Exemplary methods for calculating detectability and diagnosability performances are disclosed in the U.S. Pat. No. 5,922,079 of Booth, et al.

Upon user selection of one of the faults (e.g., fault $F_2$) displayed in the dialog 1200, a list of faults ($F_1$, $F_3$, $F_4$) that interfere with the selected fault may be displayed in a new, "Ambiguity Group" dialog 1300 (FIG. 13). And, for each of the faults that interfere with the fault $F_2$, a corresponding test suite degree of interference may be displayed. By way of example, a fault displayed in the dialog 1200 could be selected by right-clicking on the fault with a graphical mouse pointer.

Upon user selection of one of the faults (e.g., fault $F_1$) that interferes with the fault $F_2$, from the dialog 1300, a list of syndromes shared by the faults $F_1$ and $F_2$ may be displayed in a new, "Shared Syndromes" dialog 1400 (FIG. 14). For each syndrome in the list of syndromes, a corresponding one of the syndrome degrees of interference between the faults $F_1$ and $F_2$ may be displayed. Optionally, relative frequencies at which each of the shared syndromes appears for all faults in the test suite may be displayed in the dialog 1400. Also optionally, the pattern of passing and failing tests that corresponds to each of the shared syndromes may be displayed in the dialog 1400.

A user can use the information shown in the dialog 1400 to look for syndromes with a high frequency and a high degree of interference, and then interpret the commonalities of the test results in these syndromes. For example, in FIG. 14, the test $T_3$ would be of particular interest, because the degree of interference between the faults $F_2$ and $F_1$ is high when this test returns a "Fail" test result. The user can then use this insight to go back and review the definitions for this test and discern why this test does not differentiate between the faults $F_2$ and $F_1$. The test $T_3$ could then be changed, or a new test could be added in order to improve diagnosability of the faults $F_2$ and $F_1$.

What is claimed is:

1. A method for diagnosing a degree of interference between a plurality of faults in a system under test, the faults being detected by means of applying a test suite to the system under test, comprising:

for each of the plurality of faults, and for each of a plurality of test syndromes, where a test syndrome is a pattern of passing and failing tests of the test suite, determining relative frequencies at which particular ones of the faults are coupled with particular ones of the syndromes; and using the relative frequencies at which particular ones of the faults are coupled with particular ones of the syndromes to calculate and display to a user, via a graphical user interface, and for the test suite as a whole, test suite degrees of interference between pairs of the faults.

2. The method of claim 1, wherein determining the relative frequencies at which particular ones of the faults are coupled with particular ones of the syndromes comprises generating a matrix of faults versus test syndromes, where the intersection of a particular fault and a particular syndrome provides the relative frequency at which the particular fault is coupled with the particular syndrome.

3. The method of claim 1, wherein determining the relative frequencies at which particular ones of the faults are coupled with particular ones of the syndromes comprises performing a statistical simulation of executing the tests of the test suite on the components of the system under test.

4. The method of claim 1, wherein determining the relative frequencies at which particular ones of the faults are coupled with particular ones of the syndromes comprises analyzing historical test data of executing the tests of the test suite on the components of the system under test.

5. The method of claim 1, further comprising:

modeling the system under test as one or more components, each of which may be associated with one or more faults;

modeling the test suite as a plurality of tests that pass or fail based on one or more of the components exhibiting their associated faults;

modeling each test as covering some portion of one or more of the faults, based on each test's ability to detect one or more of the faults.

6. The method of claim 5, wherein the plurality of faults comprises at least one of: component faults and multiple component faults.

7. The method of claim 1, wherein a particular test suite degree of interference ($DOI_{Test\ Suite}$) between a pair of faults F1 and F2 is calculated as:

$$DOI_{Test\ Suite}(F1,F2) = \Sigma_{All\ S}[c^*[\min(f_{s,1},f_{s,2})]]/\Sigma_{All\ S}(f_{s,1}+f_{s,2});$$

where S is a particular syndrome, c is a constant, $f_{s,1}$ is the relative frequency at which the fault F1 is coupled with the syndrome S, $f_{s,2}$ is the relative frequency at which the fault F2 is coupled with the syndrome S, and $\min(f_{s,1}, f_{s,2})$ is a function that determines the minimum of $f_{s,1}$ and $f_{s,2}$.

8. The method of claim 7, wherein c=2.

9. The method of claim 1, further comprising:

displaying to the user, via the graphical user interface, a list of the faults; and upon user selection of one of the faults (F1), and via the graphical user interface, i) displaying a list of faults that interfere with the fault F1, and ii) for each of the faults that interfere with the fault F1, displaying a corresponding one of the test suite degrees of interference between pairs of the faults.

10. The method of claim 9, further comprising:

displaying with each of the faults, in a common dialog of the graphical user interface, a relative frequency at which the fault appears for all syndromes in the test suite.

11. The method of claim 9, further comprising:

displaying with each of the faults, in a common dialog of the graphical user interface, a number of faults that interfere with each fault.

12. The method of claim 9, further comprising:

using the relative frequencies at which particular ones of the faults are coupled with particular ones of the syndromes to calculate and display to a user, via a graphical user interface, and for particular syndromes, syndrome degrees of interference between pairs of the faults.

13. The method of claim 12, further comprising:

upon user selection of one of the faults (F2) that interferes with the fault F1, and via the graphical user interface, i) displaying a list of syndromes shared by the faults F1 and F2, and ii) displaying for each syndrome in the list of syndromes, a corresponding one of the syndrome degrees of interference between the faults F1 and F2.

14. The method of claim 13, further comprising:

for each of the syndromes shared by the faults F1 and F2, displaying to the user via the graphical user interface, a relative frequency at which the syndrome appears for all faults in the test suite.

15. The method of claim 14, further comprising:

for each of the syndromes shared by the faults F1 and F2, displaying to the user via the graphical user interface, the pattern of passing and failing tests that corresponds to the syndrome; and displaying the list of syndromes, the corresponding ones of the syndrome degrees of interference between the faults F1 and F2, the relative frequencies at which each syndrome appears for all faults in the test suite, and the patterns of passing and failing tests that correspond to the syndromes, in a common dialog of the graphical user interface.

16. The method of claim 13, further comprising:

for each of the syndromes shared by the faults F1 and F2, displaying to the user via the graphical user interface, the pattern of passing and failing tests that corresponds to the syndrome.

17. The method of claim 1, further comprising:

using the relative frequencies at which particular ones of the faults are coupled with particular ones of the syndromes to calculate and display to a user, via a graphical user interface, and for particular syndromes, syndrome degrees of interference between pairs of the faults.

18. A method for diagnosing a degree of interference between a plurality of faults in a system under test, the faults being detected by means of applying a test suite to the system under test, comprising:

for each of the plurality of faults, and for each of a plurality of test syndromes, where a test syndrome is a pattern of passing and failing tests of the test suite, determining relative frequencies at which particular ones of the faults are coupled with particular ones of the syndromes; and using the relative frequencies at which particular ones of the faults are coupled with particular ones of the syndromes to calculate and display to a user, via a graphical user interface, and for particular syndromes, syndrome degrees of interference between pairs of the faults.

19. The method of claim 18, wherein determining the relative frequencies at which particular ones of the faults are coupled with particular ones of the syndromes comprises generating a matrix of faults versus test syndromes, where the intersection of a particular fault and a particular syndrome provides the relative frequency at which the particular fault is coupled with the particular syndrome.

20. The method of claim 18, wherein determining the relative frequencies at which particular ones of the faults are coupled with particular ones of the syndromes comprises performing a statistical simulation of executing the tests of the test suite on the components of the system under test.

21. The method of claim 18, wherein determining the relative frequencies at which particular ones of the faults are coupled with particular ones of the syndromes comprises analyzing historical test data of executing the tests of the test suite on the components of the system under test.

22. The method of claim 18, further comprising:
modeling the system under test as one or more components, each of which may be associated with one or more faults;
modeling the test suite as a plurality of tests that pass or fail based on one or more of the components exhibiting their associated faults;
modeling each test as covering some portion of one or more of the faults, based on each test's ability to detect one or more of the faults.

23. The method of claim 22, wherein the plurality of faults comprises at least one of: component faults and multiple component faults.

24. The method of claim 23, wherein a particular syndrome degree of interference ($DOI_s$) between a pair of faults F1 and F2 is calculated as:

$$DOI_s(F1,F2)=c*[\min(f_{s,1},f_{s,2})]/(f_{s,1}+f_{s,2});$$

where S is a particular syndrome, c is a constant, $f_{s,1}$ is the relative frequency at which the fault F1 is coupled with the syndrome S, $f_{s,2}$ is the relative frequency at which the fault F2 is coupled with the syndrome S, and $\min(f_{s,1}, f_{s,2})$ is a function that determines the minimum of $f_{s,1}$ and $f_{s,2}$.

25. The method of claim 24, wherein c=2.

26. The method of claim 23, further comprising:
displaying to the user, via the graphical user interface, i) a list of the syndromes shared by two interfering ones of the faults, and ii) for each of the syndromes shared by the two interfering ones of the faults, a corresponding one of the syndrome degrees of interference between the two interfering ones of the faults.

27. The method of claim 26, further comprising:
for each of the syndromes shared by the two interfering ones of the faults, displaying to the user via the graphical user interface, a relative frequency at which the syndrome appears for all faults in the test suite.

28. The method of claim 26, further comprising:
for each of the syndromes shared by the two interfering ones of the faults, displaying to the user via the graphical user interface, the pattern of passing and failing tests that corresponds to the syndrome.

29. Apparatus for diagnosing a degree of interference between a plurality of faults in a system under test, the faults being detected by means of applying a test suite to the system under test, comprising:
computer-readable media; and
computer-readable program code, stored on the computer-readable media, including:
code to, for each of the plurality of faults, and for each of a plurality of test syndromes, where a test syndrome is a pattern of passing and failing tests of the test suite, determine relative frequencies at which particular ones of the faults are coupled with particular ones of the syndromes; and
code to use the relative frequencies at which particular ones of the faults are coupled with particular ones of the syndromes to calculate and display to a user, via a graphical user interface, and for the test suite as a whole, test suite degrees of interference between pairs of the faults.

30. The apparatus of claim 29, wherein the code to determine the relative frequencies at which particular ones of the faults are coupled with particular ones of the syndromes comprises performs a statistical simulation of executing the tests of the test suite on the components of the system under test.

31. The apparatus of claim 29, wherein a particular test suite degree of interference ($DOI_{Test\ Suite}$) between a pair of faults F1 and F2 is calculated by the code as:

$$DOI_{Test\ Suite}(F1,F2)=\Sigma_{All\ S}[c*[\min(f_{s,1},f_{s,2})]]/\Sigma_{All\ S}(f_{s,1}+f_{s,2});$$

where S is a particular syndrome, c is a constant, $f_{s,1}$ is the relative frequency at which the fault F1 is coupled with the syndrome S, $f_{s,2}$ is the relative frequency at which the fault F2 is coupled with the syndrome S, and $\min(f_{s,1}, f_{s,2})$ is a function that determines the minimum of $f_{s,1}$ and $f_{s,2}$.

32. The apparatus of claim 29, further comprising:
code to display to the user, via the graphical user interface, a list of the faults; and
code to, upon user selection of one of the faults (F1), and via the graphical user interface, i) display a list of faults that interfere with the fault F1, and ii) for each of the faults that interfere with the fault F1, display a corresponding one of the test suite degrees of interference between pairs of the faults.

33. The apparatus of claim 29, further comprising:
code to use the relative frequencies at which particular ones of the faults are coupled with particular ones of the syndromes to calculate and display to a user, via a graphical user interface, and for particular syndromes, syndrome degrees of interference between pairs of the faults.

34. Apparatus for diagnosing a degree of interference between a plurality of faults in a system under test, the faults being detected by means of applying a test suite to the system under test, comprising:
computer-readable media; and
computer-readable program code, stored on the computer-readable media, including:
code to, for each of the plurality of faults, and for each of a plurality of test syndromes, where a test syndrome is a pattern of passing and failing tests of the test suite, determine relative frequencies at which particular ones of the faults are coupled with particular ones of the syndromes; and
code to use the relative frequencies at which particular ones of the faults are coupled with particular ones of the syndromes to calculate and display to a user, via a graphical user interface, and for particular syndromes, syndrome degrees of interference between pairs of the faults.

35. The apparatus of claim 34, wherein a particular syndrome degree of interference ($DOI_s$) between a pair of faults F1 and F2 is calculated by the code as:

$$DOI_s(F1,F2) = c*[\min(f_{s,1}, f_{s,2})]/(f_{s,1}+f_{s,2});$$

where S is a particular syndrome, c is a constant, $f_{s,1}$ is the relative frequency at which the fault F1 is coupled with the syndrome S, and $f_{s,2}$ is the relative frequency at which the fault F2 is coupled with the syndrome S, and $\min(f_{s,1}, f_{s,2})$ is a function that determines the minimum of $f_{s,1}$ and $f_{s,2}$.

36. The apparatus of claim 34, further comprising:

code to display to the user, via the graphical user interface, i) a list of the syndromes shared by two interfering ones of the faults, and ii) for each of the syndromes shared by the two interfering ones of the faults, a corresponding one of the syndrome degrees of interference between the two interfering ones of the faults.

* * * * *